United States Patent [19]

Honda

[11] Patent Number: 5,561,105
[45] Date of Patent: Oct. 1, 1996

[54] CHELATING REAGENT CONTAINING PHOTORESIST STRIPPER COMPOSITION

[75] Inventor: Kenji Honda, Barrington, R.I.

[73] Assignee: OCG Microelectronic Materials, Inc., Cheshire, Conn.

[21] Appl. No.: 436,550

[22] Filed: May 8, 1995

[51] Int. Cl.⁶ .................... C11D 3/20; C11D 3/30; C11D 7/26; C11D 7/32
[52] U.S. Cl. .................... 510/178; 510/176; 510/405; 510/409; 510/479; 510/480; 510/499; 134/2; 134/38; 430/260; 430/329; 430/331
[58] Field of Search .................... 252/153, 162, 252/171, 174.23, 544, 548, DIG. 8; 134/2, 38; 430/360, 329, 331

[56] References Cited

U.S. PATENT DOCUMENTS

| | | | |
|---|---|---|---|
| 3,582,401 | 6/1971 | Berilla et al. | 134/3 |
| 4,015,986 | 4/1977 | Paal et al. | 96/36 |
| 4,617,251 | 10/1986 | Sizensky et al. | 430/256 |
| 4,770,713 | 9/1988 | Ward | 134/38 |
| 4,786,578 | 11/1988 | Neisius et al. | 430/256 |
| 4,824,762 | 4/1989 | Kobayashi et al. | 430/258 |
| 4,824,763 | 4/1989 | Lee | 430/258 |
| 4,904,571 | 2/1990 | Miyashita et al. | 430/331 |
| 5,102,777 | 4/1992 | Lin et al. | 430/331 |
| 5,145,717 | 9/1992 | Drury | 427/96 |
| 5,279,791 | 1/1994 | Lee | 252/548 |
| 5,308,745 | 5/1994 | Schwartzkopf | 430/329 |
| 5,334,332 | 8/1994 | Lee | 252/548 |
| 5,472,830 | 12/1995 | Honda | 430/331 |

FOREIGN PATENT DOCUMENTS

| | | |
|---|---|---|
| 3828513 | 3/1990 | Germany . |
| 56-115368 | 9/1981 | Japan . |
| 63-208043 | 8/1988 | Japan . |
| 1-081949 | 3/1989 | Japan . |
| 64-088548 | 4/1989 | Japan . |
| 4-124668 | 4/1992 | Japan . |
| 4-350660 | 12/1992 | Japan . |
| 5-045894 | 2/1993 | Japan . |

*Primary Examiner*—Paul Lieberman
*Assistant Examiner*—Gregory R. Delcotto
*Attorney, Agent, or Firm*—William A. Simons

[57] ABSTRACT

A non-corrosive photoresist composition containing:
 (a) 20–70% by weight of an organic polar solvent having a dipole moment of more than 3.5;
 (b) 70–20% by weight of selected amine compounds;
 (c) an effective amount of a chelating reagent comprising a mono- or poly-valent acid type of ligand covalently attached to a polymeric or oligomeric backbone; and
 (d) optionally 0–10% by weight of selected amino acid having a hydroxyl group.

10 Claims, No Drawings

CHELATING REAGENT CONTAINING PHOTORESIST STRIPPER COMPOSITION

BACKGROUND OF THE INVENTION

1. Field of the Invention

The present invention relates to a photoresist stripper composition containing the combination of (1) selected solvents; (2) selected amines; (3) selected chelating reagents; and optionally (4) selected corrosion inhibitors.

2. Description of the Prior Art

The photoresist stripper art is replete with numerous references to stripper combinations containing both a polar solvent and an amine compound. The presence of an amine in photoresist stripper compositions has been judged to be essential to effectively remove cross-linked resist films. However, amine-type photoresist strippers sometimes have a serious problem of corrosion, especially with aluminum substrates.

It is believed that the corrosion is caused in part by the ionization of water with the amine in post-stripping water rinses, as residual stripper solution may be retained on the substrate surface and/or substrate carrier after the stripping step. In other words, the amine component of the stripper composition does not corrode the substrate by itself, but may trigger water to cause the corrosion.

To solve this problem, an intermediate rinse step with an organic solvent has been used between the stripping step and the post-stripping rinse with water. For example, isopropyl alcohol is known to be useful for this purpose. However, such intermediate rinses are not necessarily desirable because overall stripping operation becomes more complicated and, furthermore, an additional solvent waste is produced. Accordingly, if amine-type strippers are to be further employed, there is a need to solve this corrosion problem without intermediate organic solvent washes.

Another serious problem related with currently used stripper compositions is mobile metallic ion transfer from a stripper solution onto a substrate. This results in damage of semiconductor integrated circuit devices by contamination with alkali or transition metals. Any metallic contamination leads to a short life of the devices.

The metallic contaminants may come from stripper components or photoresist components. Another mechanism of the contamination is corrosion of a stainless stripper bath with a stripper composition, particularly with an amine-based stripper, during the stripping process.

To solve this problem, several actions have been taken:

(1) Removal of metallic contaminants from strippers and photoresists as much as possible.

(2) Inhibition of the corrosion of stripper bath by adding a corrosion inhibitor to stripper compositions.

(3) Stabilization of mobile metallic ions in a stripper solution by adding a chelating reagent to stripper compositions.

Illustrative of references suggesting photoresist stripper compositions containing the combination of a polar solvent and an amine compound are the following:

1. U.S. Pat. No. 4,617,251, which issued to Sizensky et al. on Oct. 14, 1986, teaches a positive photoresist stripping composition containing (A) selected amine compound (e.g., 2-(2-aminoethoxy)ethanol; 2-(2-aminoethylamino)ethanol; and mixtures thereof) and (B) selected polar solvents (e.g., N-methyl-2-pyrolidinone, tetrahydrofurfuryl alcohol, isophorone, dimethyl sulfoxide, dimethyl adipate, dimethyl glutarate, sulfolane, gamma-butyrolactone, N,N-dimethylacetamide and mixtures thereof). The reference further teaches that water as well as dyes or colorants, wetting agents, surfactants and antifoamers may be added into this composition.

2. U.S. Pat. No. 4,770,713, which issued to Ward (J. T. Baker) on Sep. 13, 1988, teaches a positive photoresist stripping composition containing (A) a selected amide (e.g., N,N-dimethyl acetamide; N-methyl acetamide; N,N-diethyl acetamide; N,N-dipropyl acetamide; N,N-dimethyl propionamide; N, N-diethyl butyramide and N-methyl-N-ethyl propionamide) and (B) selected amine compound (e.g., monoethanolamine, monopropanolamine, methyl-aminoethanol). The patent also teaches this stripper may optionally contain a water miscible nonionic detergent (e.g., alkylene oxide condensates, amides and semi-polar nonionics).

3. U.S. Pat. No. 4,786,578, which issued to Neisius et al. (Merck) on Nov. 22, 1988, teaches a rinse solution used after a photoresist stripper, said rinse solution containing (A) a nonionic surfactant (e.g., ethoxylated alkylphenol, fatty and ethoxylate, fatty alcohol ethoxylate or ethylene oxide/propylene oxide condensate) and (B) an organic base (e.g., mono-, di-, or tri-ethanolamine).

4. U.S. Pat. No. 4,824,762, which issued to Kobayashi et al. (TOK) on Apr. 25, 1989, teaches photoresist stripping post-rinse solution containing (A) glycol ether (e.g., diethylene glycol monomethyl ether, dipropylene glycol monomethyl ether, tripropylene glycol monomethyl ether) and (B) an aliphatic amine (e.g., monoethanolamine or tri-isopropylamine).

5. U.S. Pat. No. 4,824,763, which issued to Lee (EKC) on Apr. 25, 1989, teaches positive-working photo-resist stripping composition containing (A) triamine (e.g., diethylenetriamine) and (B) a polar solvent (e.g., N-methyl-2-pyrrolidone, dimethylformamide, butyrolactone, aliphatic hydrocarbons, aromatic hydrocarbons, chlorinated hydrocarbons).

6. U.S. Pat. No. 4,904,571, which issued to Miyashita et al. on Feb. 27, 1990, teaches printed circuit board photoresist stripper composition containing (A) a solvent (e.g., water, alcohols, ethers, ketones, chlorinated hydrocarbons and aromatic hydrocarbons); (B) an alkaline compound dissolved in said solvent (e.g., primary amines, secondary amines, tertiary amines, cyclic amines, polyamines, quaternary ammonium amines, sulfonium hydroxides, alkali hydroxides, alkali carbonates, alkali phosphates and alkali pyrophosphates); and (C) a borohydride compound dissolved in said solvent (e.g., sodium borohydride, lithium borohydride, dimethyl amine borone, trimethyl amine borone, pyridane borone, tert-butyl amine borone, triethyl amine borone, and morpholine borone).

7. U.S. Pat. No. 5,279,791, which issued to Lee on Jan. 18, 1994, teaches a stripping composition for removing resists from substrates containing (A) hydroxylamine (e.g., $NH_2OH$); (B) at least one alkanolamine; and optionally (C) at least one polar solvent.

8. U.S. Pat. No. 5,334,332, which issued to Lee (EKC) on Aug. 2, 1994, teaches the use of ethylenediamine tetraacetic acid and 1,2-dihydroxybenzene as a chelating reagent to reduce the surface metal contamination on wafers.

9. German Published Patent Application No. 3828513, which published on Mar. 1, 1990 and is assigned to Merck GMBH, teaches a positive and negative photoresist stripper composition containing (A) an aprotic polar solvent (e.g., 1,3-dimethyl-2-imidazolidinone or 1,3-dimethyl-tetrahydropyrimidinone); and (B) an organic base (e.g., alkanolamine).

10. Japanese Published Patent Application No. 56-115368, which was published on Sep. 10, 1981 and is assigned to San Ei Chemical Industries, KK, teaches a photoresist stripping composition containing (A) nonionic surface activator (e.g., a polyethylene glycol ether); (B) organic solvent (e.g., cyclohexanone); and (C) either a swelling agent (e.g., polyethylene glycol) or penetrant (e.g., 2-aminoethanol).

11. Japanese Published Patent Application No. 63-208043, published on Aug. 29, 1988, teaches a positive-working photoresist stripper composition containing (A) 1,3-dimethyl-2-imidazolidinone; (B) a water-soluble organic amine (e.g., monoethanolamine, 2-(2-aminoethoxy) ethanol, triethylene(tetramine). The application also teaches a surfactant may be added to the stripper.

12. Japanese Published Patent Application No. 1-081949, which published on Mar. 28, 1989 and is assigned to Asahi Chemical, teaches a positive-working photoresist stripper composition containing (A) gamma-butyrolactone, N-methyl-formamide, N,N-dimethylformamide, N,N-dimethylacetoamide or N-methylpyrrolidone; (B) an amino alcohol (e.g., N-butyl-ethanolamine and N-ethyldiethanolamine); and (C) water.

13. Japanese Published Patent Application No. 4-350660, which is assigned to Texas Instruments, Japan and Kanto Chemical, Inc., teaches a stripper for positive photoresists comprising (A) 1,3-dimethyl-2-imidazolidinone (DMI), (B) dimethylsulfoxide (DMSO) and (C) a water-soluble amine (e.g., monoethanolamine or 2-(2-aminoethoxy)ethanol wherein the amount of the water-soluble amine is 7–30% by weight.

14. Japanese Published Patent Application No. 5-045894, which published to Ward (ACT, Inc.) on Feb. 26, 1993, teaches the use of 6-hydroxyquinoline as a chelating corrosion inhibitor in a positive photoresist stripper.

In particular, recently, the approach with chelating reagents to reduce the surface metal contamination has attracted much attention. However, most of the compounds so far used have several problems like a poor solubility in a stripper solution, a strong acid/base reaction with a stripper component, or a higher toxicity.

BRIEF SUMMARY OF THE INVENTION

The present invention, therefore, is directed to a resist stripper composition comprising:

(a) from about 20 to about 70% by weight of an organic polar solvent having a dipole moment of more than 3.5;

(b) from about 70 to about 20% by weight of an amine compound selected from the group consisting of compounds having the formula (I):

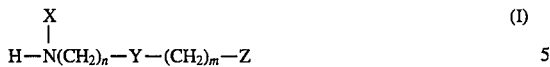

wherein n and m are each independently an integer ranging from 0–5, inclusive; X is hydrogen, alkyl, or alkoxy group; Y is either —O— or —NH—; and Z is hydrogen, —OH, or —NH$_2$;

(c) an effective chelating amount of a chelating reagent comprising a mono- or poly-valent acid type of ligand covalently attached to a polymeric or oligomeric backbone; and (d) optionally from about 0 to about 10% by weight of an amino acid selected from the group consisting of compounds having the formula (II):

wherein p is an integer ranging from 1–3; $R^1$ and $R^2$ are each independently selected from the group consisting of hydrogen and compounds having the formula (III):

wherein $R^5$, $R^6$, and $R^7$ are each independently selected from hydrogen, —OH, —CH$_2$OH, alkyl, alkoxy phenyl, mono-, di-, or tri-hydroxy-substituted phenyl groups; and $R^3$ and $R^4$ are each independently selected from the group consisting of hydrogen and compounds having the formula (IV):

wherein X', Y', and Z' are each independently selected from hydrogen, —OH, —CH$_2$OH, —CH$_2$CH$_2$OH, —CH$_2$COOH, alkyl, or alkoxy group, and at least one of them is —OH, —CH$_2$CH$_2$OH, or —CH$_2$OH; all percentages based on the stripper composition weight.

DESCRIPTION OF THE PREFERRED EMBODIMENTS

As stated above, the stripper of the present invention has three critical components, namely:

(a) a polar solvent having a dipole moment of at least 3.5;

(b) an amine;

(c) a chelating reagent comprising a mono- or poly-valent acid type of ligand covalently attached to a polymeric or oligomeric backbone; and, optionally, (d) an amino acid.

The solvent used in this stripper composition should have a good solubility for cross-linked resist films. Therefore, a solvent is necessary to efficiently remove cross-linked resist films which are strongly adhering to the substrate.

The solvent should meet the following criteria:

(1) Its dipole moment should be more than 3.5.

(2) Its boiling point should be more than 130°–180° C.

(3) Its flash point should be more than 60°–90° C.

Among various candidates, amides are particularly preferred. In particular, cyclic amides such as N-alkyl-2-pyrrolidones (e.g., N-hydroxyethyl-2-pyrrolidone) and 1,3-dialkyl-2-imidazolidinones are especially preferable from a view point of stripping power and toxicity. A suitable solvent mixture may be an admixture of N-hydroxyethylpyrrolidone (HEP) and 1,3-dimethyl-2-imidozolidinone (DMI) wherein the mixing ratio of HEP:DMI is from about 95:5% to about 5:95% by weight as HEP is a known safer solvent and DMI is a powerful stripping solvent.

As mentioned above, another major component of the stripper is an amine compound. Alkanolamines are particularly preferable. But an amine cannot efficiently dissolve cross-linked resist films by itself, probably because of its high viscosity.

Various amines can be used in the stripper composition of this invention. Particularly, amines having at least one hydroxyl group, so-called alkanolamines, are the most preferable; for example, monoethanolamine, 2-(2-aminoethoxy) ethanol, 2-(2-aminoethylamino)ethanol, and the like.

The third essential component of the stripper composition of the present invention is a chelating reagent comprising a mono- or poly-valent acid type of ligand covalently attached to a polymeric or oligomeric backbone.

Examples of suitable mono- or poly-valent acid type of ligands for the use in the present invention include N-dihydroxyethylglycine, iminodiacetic acid, nitrilotriacetic acid, N-hydroxylethyliminodiacetic acid, ethylenediaminetetraacetic acid, N,N'-ethylenediaminediacetic acid, N-hydroxyethylethylenediaminetriacetic acid, diethylenetriaminepentaacetic acid, 1,2-cyclohexanediaminetetraacetic acid, trimethylenediaminetetraacetic acid, ethyleneglycol diethyl ether diaminetetraacetic acid, ethylenediaminetetrapropionic acid, ethylenediaminedipropionic diacetic acid, betaaminoethylphosphonic N,N-diacetic acid, aminoethylphosphonic N,N-diacetic acid, and other so-called complexane type of compounds.

Examples of suitable polymeric or oligomeric backbones for the use in the present invention include phenolic resins such as novolak and polyhydroxystyrene polymers; preferably oligomeric resins having a molecular weight of 200–5, 000 because of their solubility in a stripper solution.

The chelating ligands can be attached to the polymeric or oligomeric backbones through a covalent bond. As one of the possible approaches, Mannich reaction can be applied as follows:

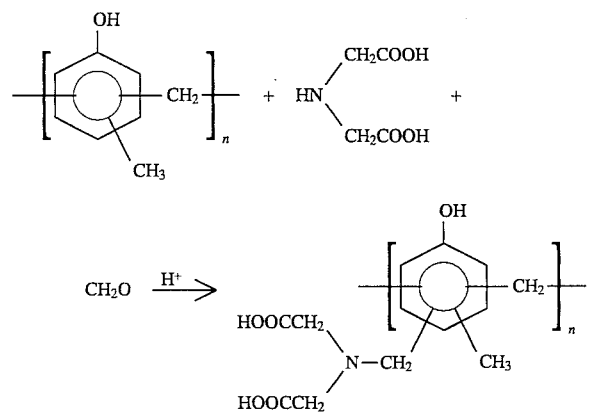

Another example of the chelating ligand-attached oligomer or polymer is a polyether having a molecular weight of about 200 to 5000 polyethylene oxide, polypropylene oxide, or their copolymers, to which a mono- or poly-valent acid group is covalently attached. For example, the following surfactants are commercially available:

(A) Polyethyleneoxide attaching a terminal carboxylic acid group such as nonylphenol-$(CH_2CH_2)_9$—COOH (Sandopan MA-18 from Sandoz Chemical), tridecyl-$(CH_2CH_2O)_{18}$—COOH (Sandopan JA-36 from Sandoz Chemical), nonylphenol-$CH_2CH_2O)_{10}$-sulfosuccinic acid (Monawet 1240 from Mona Industries).

(B) Polyethyleneoxide attaching a terminal phosphoric acid group such as RO—$(CH_2CH_2)O_n$—$PO_3H_2$ (Adekacol PS-440E, PS-509E from Asahi Denka Co. Ltd.; Gafac RB-410 from Tohoh Chemical).

(C) Polyethyleneoxide grafting a fumaric acid group onto the side chain such as POLY-TERGENT® CS-1 from Olin Corporation.

(D) Polyacrylic type dispersant such as polyacrylic/maleic copolymer (Sokalan CP from BASF), polyacrylate dispersant (Alkasperse from GAF, Sokalan PA from BASF), polymaleic copolymeric dispersant (Sokalan PM from BASF), polyitaconic dispersant (PIA 728 from Iwata Chemical).

above-noted chelating reagent that causes the desired chelating effect.

An optional component of the stripper composition of this invention is a selected amino acid compound working as a corrosion inhibitor. Examples of compounds within this class include: tricine, bicine, DL-homoserine, D-homoserine, L-homoserine, DL-threonine, D-allo-threonine, L-allo-threonine, D-threonine, L-threonine, DL-3-hydroxynorvaline, DL-metathroxine, D-4-hydroxyphenylglycine, DL-tyrosine, D-tyrosine, L-tyrosine, 3-(3,4-dihydroxyphenyl)-DL-alanine, 3-(3,4-dihydroxyphenyl)-L-alanine, 3-(2, 4,5-trihydroxyphenyl)-DL-alanine, DL-alpha-methyltyrosine, L-alphamethytyrosine, (−)-3-(3,4-dihydroxyphenyl)-2-methyl-L-alanine, DL-threo-3-phenylserine, DL-threo-3, 4-dihydroxyphenylserine, and the like. Preferable candidates among them are tricine, bicine, 3-(2,4,5-trihydroxyphenyl)-DL-alanine, and DL-threo-3,4-dihydroxyphenylserine, in terms of cost/performance balance.

Examples of compounds outside the formula (II) which may be also useful for this function include: DL-4-amino-3-hydroxybutyric acid, (3's, 4,'s)-(−)-statine, (+)-muramic acid, 5-hydroxy-DL-lysine, cis-4-hydroxy-D-proline, cis-4-hydroxy-L-proline, trans-4-hydroxy-L-proline, mimosine, N-(4-hydroxyphenyl)glycine, 3,3'5-triiodo-L-thyronine, D-thyroxine, L-thyroxine, D-4-hydroxyphenylglycine, 3-nitro-L-tyrosine, 3-amino-L-tyrosine, 3,5-dinitro-L-tyrosine, chloroacetyl-L-tyrosine, N-acety-1-tyrosinaminde, and the like.

Water (preferably, deionized water) can be added as another optional component to the stripper composition of this invention, because some of the chelating ligand-containing oligomers or polymers and amino acids are not well soluble in organic solvents. In that case, water is helpful to stabilize the stripper solution without precipitation. However, if water is added it may work as a precipitation enhancer to resist components. Therefore, a desirable amount of water in the stripper composition is between zero and 20% by weight based on the total weight of stripper solution.

The preferred amounts of these four ingredients are about 40–65% polar solvent; about 25–60% amine compound; about 0.5%–10% of the chelating reagent; optionally, about 1–5% of amino acid; and about 1–5% water, all based on the weight of the stripper composition.

Various other ingredients known to those skill in the art may optionally be included in the stripping composition e.g. dyes or colorants, wetting agents, surfactants, antifoamers and so forth. Generally, an amount of each of these optional ingredients would be about 0.1–0.5% by weight, based on the total stripper composition.

The described stripping composition is used in removing an organic polymeric material from a substrate. The method of the invention is carried out by contacting an organic polymeric material with the described stripping composition. The actual conditions, i.e., temperature, time, and the like, may vary over wide ranges and are generally dependent on the nature and thickness of the organic polymeric material to be removed, as well as other factors familiar to those skilled in the art. In general, however, temperatures ranging from about 25° C. to about 100° C. for a period of about 10 minutes to about 60 minutes are typical.

A variety of means can be employed in contacting the organic polymeric material with the stripping composition in the practice of the invention. For example, the substrate containing the organic polymeric material can be immersed in a stripping bath or the stripping composition can be sprayed over the surface of the organic polymeric material, as will be apparent to those skilled in the art.

The stripping composition of the invention is effective in removing a wide variety of organic polymeric materials from substrates. Exemplificative organic polymeric materials include positive- and negative-working g/i-line and deep UV resists, electron beam resists, X-ray resists, ion beam resists, as well as organic dielectric materials such as polyimide resins, and so forth. Specific examples of organic polymeric materials which can be removed in the practice of the invention include positive resists containing phenol formaldehyde resins or poly(p-vinylphenol); negative resists containing cyclized polyisoprene or poly(p-vinylphenol); and polymethyl-methacrylate-containing resists. In particularly preferred embodiments of the invention, the stripping composition has been found to be highly effective in removing positive resists containing a novolak resin and a diazo ketone sensitizer, e.g., ortho naphthoquinone diazide sulfonic acid ester; resists of this type include HPR 204 POSITIVE RESIST, HPR 504 POSITIVE RESIST, HPR 6500 Series POSITIVE RESIST, and OiR32 POSITIVE RESIST all available commercially from OCG Microelectronic Materials, Inc. The organic polymeric material can be removed from any of the conventional substrates known to those skilled in the art, such as silicon, silicon dioxide, silicon nitride, polysilicon, aluminum, aluminum alloys, copper, copper alloys, and so forth.

The present invention is further described in detail by means of the following Examples and Comparison. All parts and percentages are by weight and all temperatures are degrees Celsius unless explicitly stated otherwise.

SYNTHESIS EXAMPLE 1

The novolak oligomer which was made from m-cresol, p-cresol, and 3,5-xylenol by the addition-condensation reaction with formaldehyde having Mw=2,000 was used for this reaction with iminodiacetic acid (IDA) as follows: The novolak powder, 250 g, was dissolved in 25 wt. % tetramethylammonium hydroxide aqueous solution at 60° C. with stirring. IDA, 533 g, was dissolved in 2,640 g of N-methylpyrrolidone, and the resulting solution was slowly added to the above novolak solution at 60° C. with vigorous stirring. Then, 37 wt. % formalin, 336.5 g, was added dropwise to the reaction mixture. The reaction was carried out at 60° C. for 5 hours. Then, the reaction solution was poured into a large excess amount of 1 wt. % HCl aqueous solution with stirring. The resultant polymer was suspended in solution, and it was filtered with a paper filter.

The product, hereafter referred to as COL, was characterized by proton NMR to determine a degree of IDA incorporation onto the novolak backbone. Approximately 55% of the phenolic moieties on the novolak backbone was modified with IDA under the above-described condition.

FORMULATION EXAMPLE 1

Silicon wafers, 125 mm in diameter, were used for the following STRIPPING tests which were carried out at 90° for 10 minutes in a quartz tank without recirculation or filtration. After the processing, the wafers were immediately rinsed with deionized water in an overflow tank for 10 minutes at room temperature and spun dry.

The stripping efficiency was determined by measuring the amount of residues left on the wafers after the removal of a photoresist film casted with a stripper solution which consists of N-methylpyrrolidone (NMP), 50 g, 2-(2-aminoethoxy)ethanol (AEE), 50 g, and the product of Synthesis 1, COL, 0.50 g at a concentration of 0.5 wt. % to the total stripper weight. For this measurement, OCG positive i-line photoresist, OiR32, was spun coated on the wafers, exposed, developed, and hard baked at 150° C. for 15 minutes. The remaining residues on the wafers after the stripping were detected as Light Point Defect (LPD) with a Censor ANS100 light scattering equipment. LPD's which are bigger than 0.15 micron in diameter were measured as residual LPD to evaluate the stripping efficiency.

The metallic contamination on the wafers was evaluated by using a total reflection X-ray fluorescence spectrometer (TXRF) according to the method published by P. W. Mertens et al., in Proc. 38th Annual Meeting of the IES (1992) pp. 475–482.

EXAMPLE 2

The same experiment, as in Example 1, was repeated except POLY-TERGENT CS-1 acid type surfactant obtained from Olin Corporation was added instead of COL, the product of Synthesis 1.

COMPARISON 1

The same experiment as in Example 1 was repeated, except no COL, the product of Synthesis 1 was added.

TABLE 1

| | Residual LPD | Metal ($\times 10^9$ atom/cm$^2$) | |
|---|---|---|---|
| | (#/wafer) | Fe | Cu |
| Example 1 | 1,500 | 1.0 | 1.0 |
| Example 2 | 800 | 2.0 | 1.0 |
| Comparison 1 | 1,000 | 60.0 | 10.0 |

This result indicates that both of the oligomeric chelating reagents, COL and CS-1, can reduce the metallic contamination to satisfactory extent without any damage of the stripping power.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A resist stripper composition comprising:
   (a) from about 20 to about 70% by weight of an organic polar solvent having a dipole moment of more than 3.5;
   (b) from about 70 to about 20% by weight of an amine compound selected from the group consisting of compounds having the formula (I):

wherein n and m are each independently an integer ranging from 0–5, inclusive; X is hydrogen, alkyl, or alkoxy group; Y is either —O— or —NH—; and Z is hydrogen, —OH, or —NH$_2$;

(c) an effective amount of a chelating reagent comprising a mono- or poly-valent acid ligand covalently attached to a polymeric or oligomeric backbone wherein said polymeric or oligomeric backbone is selected from the group consisting of a phenolic resin having a weight average molecular weight of about 200 to about 5000 and a polyether having a weight molecular weight of 200 to about 5000; and (d) optionally from about 0 to about 10% by weight of an amino acid selected from the group consisting of compounds having the formula (II):

(II)

wherein n is an integer ranging from 1–3; $R^1$ and $R^2$ are each independently selected from the group consisting of hydrogen and compounds having the formula (III):

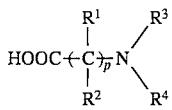
(III)

wherein $R^5$, $R^6$, and $R^7$ are each independently selected from hydrogen, —OH, —CH$_2$OH, alkyl, alkoxy, phenyl, and mono-, di- or tri-hydroxy-substituted phenyl groups; and $R^3$ and $R^4$ are each independently selected from the group consisting of hydroxy and compounds having the formula (IV):

(IV)

wherein X', Y', and Z' are each independently selected from hydrogen, —OH, —CH$_2$OH, —CH$_2$CH$_2$OH, —CH$_2$COOH, alkyl, or alkoxy group, and at least one of them is —OH, —CH$_2$CH$_2$OH, or —CH$_2$OH, all percents based on the weight of the stripper composition.

2. The stripper composition of claim 1 wherein said solvent (a) is a cyclic amide.

3. The stripper composition of claim 2 wherein said cyclic amide is selected from the group consisting of N-alkyl-2-pyrrolidone, N-hydroxyalkyl-2-pyrrolidone, and 1,3-dialkyl-2-imidazolidinone.

4. The stripper composition of claim 1 wherein said amine (b) is an alkanolamine having at least one hydroxyl group per one molecule.

5. The stripper composition of claim 4 wherein said alkanolamine is selected from the group consisting of monoethanolamine, 2-(2-aminoethoxy)ethanol and 2-(2-aminoethylamino)ethanol, diethanolamine, and triethanolamine.

6. The stripper composition of claim 1 wherein said ligand is selected from the group consisting of N-dihydroxyethylglycine, iminodiacetic acid, nitrilotriacetic acid, N-hydroxylethyliminodiacetic acid, ethylenediaminetetraacetic acid, N,N'-ethylenediaminediacetic acid, N-hydroxyethylethylenediaminetriacetic acid, diethylenetriaminepentaacetic acid, 1,2-cyclohexanediaminetetraacetic acid, trimethylenediaminetetraacetic acid, ethyleneglycol diethyl ether diaminetetraacetic acid, ethylenediaminetetrapropionic acid, ethylenediaminedipropionic diacetic acid, betaaminoethylphosphonic N,N-diacetic acid, and aminoethylphosphonic N,N-diacetic acid.

7. The stripper composition of claim 1 wherein said phenolic resin is a novolak resin which is made by addition-condensation reaction of phenolic monomers with aldehydes in the presence of acid catalyst.

8. The stripper composition of claim 1 wherein said phenolic resin is a homopolymer or co-polymers of hydroxystyrenes which is made by radical polymerization, cationic polymerization, anionic polymerization, plasma-induced polymerization, X-ray-induced polymerization, thermal polymerization, or other conventional polymerization methods applicable to common vinyl monomers.

9. The stripper composition of claim 1 wherein said amino acid (d) is present and is selected from the group consisting of: tricine, bicine, DL-homoserine, D-homoserine, L-homoserine, DL-threonine, D-allo-threonine, L-allo-threonine, D-threonine, L-threonine, DL-3-hydroxynorvaline, DL-metathroxine, DL-tyrosine, D-tyrosine, L-tyrosine, 3-(3,4-dihydroxyphenyl)-DL-alanine, 3-(3,4-dihydroxyphenyl)-L-amine, 3-(2,4,5-trihydroxyphenyl)-DL-aline, DL-alphamethyltyrosine, L-alphamethytyrosine, (−)-3-(3,4-dihydroxyphenyl)-2-methyl-L-alanine, DL-threo-3-phenylserine, and DL-threo-3,4-dihydroxyphenylserine.

10. The stripper composition of claim 9 wherein said amino acid is selected from the group consisting of tricine, bicine, 3-(2,4,5-trihydroxyphenyl)-DL-alanine, and DL-threo-3,4-dihydroxyphenylserine.

* * * * *